US011466690B2

(12) United States Patent
Fan

(10) Patent No.: US 11,466,690 B2
(45) Date of Patent: Oct. 11, 2022

(54) WATER COOLING RADIATOR WITH HEAT CONDUCTING PLATE OF FULL-INJECTION-MOLDING CLOSED HEAT RADIATION STRUCTURE

(71) Applicant: Ganglong Fan, Taiwan (CN)

(72) Inventor: Ganglong Fan, Taiwan (CN)

(*) Notice: Subject to any disclaimer, the term of this patent is extended or adjusted under 35 U.S.C. 154(b) by 258 days.

(21) Appl. No.: 17/072,845

(22) Filed: Oct. 16, 2020

(65) Prior Publication Data
US 2022/0074429 A1 Mar. 10, 2022

(30) Foreign Application Priority Data

Sep. 4, 2020 (CN) .......................... 202021915083.4

(51) Int. Cl.
| | |
|---|---|
| *F04D 13/06* | (2006.01) |
| *F04D 29/42* | (2006.01) |
| *F04D 29/58* | (2006.01) |
| *F04D 29/46* | (2006.01) |

(52) U.S. Cl.
CPC ....... *F04D 13/0673* (2013.01); *F04D 29/426* (2013.01); *F04D 29/468* (2013.01); *F04D 29/5866* (2013.01)

(58) Field of Classification Search
CPC . F04D 13/0673; F04D 29/426; F04D 29/5866
See application file for complete search history.

(56) References Cited

U.S. PATENT DOCUMENTS

| | | | | |
|---|---|---|---|---|
| 7,753,662 | B2* | 7/2010 | Lai | ...................... F04D 13/0606 |
| | | | | 417/423.15 |
| 2005/0244292 | A1* | 11/2005 | Tomioka | ............... F04D 29/426 |
| | | | | 417/423.3 |
| 2022/0065267 | A1* | 3/2022 | Tsai | .................... F04D 13/0626 |

FOREIGN PATENT DOCUMENTS

| | | | |
|---|---|---|---|
| CN | 206206191 U | 5/2017 | |
| CN | 210290365 U | 4/2020 | |

* cited by examiner

*Primary Examiner* — Woody A Lee, Jr.
*Assistant Examiner* — Brian O Peters

(57) ABSTRACT

A water cooling radiator with a heat conducting plate of full-injection-molding closed heat radiation structure, including a surface cover, a motor, a main chamber provided with a motor mounting groove and a water cooling liquid inlet/outlet, an impeller arranged at the bottom of the main chamber, a turbine housing provided at the bottom of the impeller, and a heat radiation baseplate provided with an upper baseplate and a lower baseplate. A motor transmission seat is arranged in the motor mounting groove, and the bottom of the impeller is provided with fan blades. The bottom of the upper baseplate is provided with a throttling plate connected with the upper baseplate in a limiting contact manner through a throttling plate limiting groove, and the throttling plate is provided with a throttling plate through hole. The bottom of the lower baseplate is inlaid and connected with a metal bottom heat radiation plate insert.

10 Claims, 14 Drawing Sheets

WATER COOLING RADIATOR WITH HEAT CONDUCTING PLATE OF FULL-INJECTION-MOLDING CLOSED HEAT RADIATION STRUCTURE

CROSS-REFERENCE TO RELATED APPLICATIONS

This application claims the benefit of priority from Chinese Patent Application No. 202021915083.4, filed on Sep. 4, 2020. The content of the aforementioned applications, including any intervening amendments thereto, is incorporated herein by reference.

TECHNICAL FIELD

The present invention relates to the technical field of radiators, and more particularly relates to a water cooling radiator with a heat conducting plate of a full-injection-molding closed heat radiation structure.

BACKGROUND OF THE PRESENT INVENTION

A water cooling radiator has a water inlet and a water outlet. There is liquid inside the radiator to exchange heat with a heat radiation baseplate, which can fully achieve the advantages of the water cooling and can bring away the excessive heat. This is the basic principle of the water cooling radiator.

In the prior art, the water cooling heat radiation baseplate adopts detachable bulk parts which are directly and fixedly locked to the heat radiation baseplate with screws, so that the assembling effect is poor, and the heat radiation baseplate is easy to damage. The present design adopts an integrated injection molding way of a precise mold to solve the connection relationship between the heat radiation bottom plate and a water guiding chamber that is directly locked to the heat radiation baseplate with screws.

Therefore, based on the research and improvement with respect to the existing problems, a water cooling radiator with a heat conducting plate of a full-injection-molding closed heat radiation structure is provided. In the design and development process of the water cooling radiator, the purpose is how to reduce the deformation and surface damage of the heat radiation baseplate so as not to affect the heat radiation and heat conducting effect in the machining and assembling process of the water cooling radiator. The above problems are technical problems to be solved by inventors in the actual design and development process.

SUMMARY OF THE PRESENT INVENTION

The present invention aims at providing a water cooling radiator with a heat conducting plate of a full-injection-molding closed heat radiation structure, which solves the problems of the existing water cooling radiator proposed in the background art that the deformation and surface damage of a heat radiation baseplate affect the heat radiation and heat conducting effect in the machining and assembling process of the water cooling radiator.

In order to realize the above purpose, the present invention provides a water cooling radiator with a heat conducting plate of a full-injection-molding closed heat radiation structure, which is implemented through the following specific technical means:

The water cooling radiator with the heat conducting plate of the full-injection-molding closed heat radiation structure is provided with a surface cover, a motor, a main chamber, an impeller, a turbine housing and a heat radiation baseplate. The top of the main chamber is provided with a motor mounting groove, so that the motor can be arranged at the motor mounting groove, thereby improving the integrity. A motor transmission seat is arranged in the motor mounting groove, so that a twisting force of the motor can pass through the motor transmission seat through a shaft to be transferred to the impeller. One side of the main chamber is provided with a water cooling liquid inlet/outlet respectively for inputting and outputting water cooling liquid. The impeller is arranged at the bottom of the main chamber and corresponds to the bottom outer side of the motor mounting groove. The bottom of the impeller is provided with fan blades, and the impeller is provided with a shaft connection seat. The turbine housing is arranged at the lower side of the impeller, the turbine housing is provided with a water cooling liquid outlet, and the bottom of the turbine housing is provided with a water cooling liquid suction inlet. The heat radiation baseplate is arranged at the bottom outer side of the turbine housing. The heat radiation baseplate is provided with an upper baseplate and a lower baseplate. The upper baseplate is provided with a liquid inlet hole and a liquid outlet hole. The lower end of the liquid outlet hole is fixedly connected with a guiding groove, the guiding groove is in an inverted U shape, and two ends of the guiding groove are communicated with the liquid inlet hole, so that the water cooling liquid needs to enter the guiding groove from the liquid inlet hole and enters the heat radiation baseplate through a throttling plate through hole from the guiding groove to exchange heat with a metal bottom heat radiation plate insert. The bottom surface of the upper baseplate is provided with a throttling plate limiting groove. The bottom surface of the upper baseplate is provided with a throttling plate. The throttling plate is connected with the upper baseplate in a limiting contact manner through the throttling plate limiting groove. The throttling plate is provided with a throttling plate through hole corresponding to the guiding groove. The bottom of the lower baseplate is inlaid and connected with the metal bottom heat radiation plate insert, and this locking way (i.e. the foregoing inlaid connection) avoids the deformation and copper heat radiation surface caused by directly locking the copper heat radiation baseplate with the screw.

In one embodiment, the inner side of the lower baseplate is provided with an ultrasonic loop wire and an ultrasonic column. The outer side of the baseplate is provided with mounting parts. The upper baseplate and the lower baseplate are ultrasonically fused to form an integrated heat radiation baseplate through the ultrasonic loop wire and the ultrasonic column, and the entire heat radiation baseplate is a whole body. The bottom inner side of the turbine housing is provided with a liquid guiding groove, and one end of the liquid guiding groove is connected with the water cooling liquid outlet. The bottom of the turbine housing is provided with a shaft fixed seat, and the shaft fixed seat is used for fixing the top end of a shaft.

In one embodiment, the throttling plate limiting groove is arranged on a throttling plate fixed block, and the throttling plate fixed block is fixedly connected onto the bottom surface of the upper baseplate. The water cooling liquid enters a cavity of the main chamber from the water cooling liquid inlet/outlet and enters the heat radiation baseplate through the liquid inlet hole to contact the metal bottom heat radiation plate insert. Then the water cooling liquid passes through a clearance formed between the throttling plate limiting groove and the throttling plate and passes through the water cooling liquid suction inlets from the water outlet hole to reach the inner side of the turbine housing. Then the water cooling liquid passes through the impeller and flows out from the water cooling liquid outlet, thereby forming a heat radiation mechanism. The water cooling liquid cooled externally re-enters from the water cooling liquid inlet/outlet, forming a heat radiation cycle.

In one embodiment, a first sealing ring and a second sealing ring are arranged between the upper baseplate and the lower baseplate.

In one embodiment, the quantity of the water cooling liquid suction inlets is four. The water cooling liquid suction inlets are arranged correspondingly to the liquid outlet hole, so that the water cooling liquid in the heat radiation baseplate is sucked into the turbine housing from the water cooling liquid suction inlets and is discharged from the water cooling liquid outlet.

In one embodiment, the metal bottom heat radiation plate insert is a copper bottom heat radiation plate insert.

In one embodiment, the motor is composed of a PLC circuit board, a winding and a shaft.

In one embodiment, the surface cover is fixedly connected with the main chamber through a bolt. The motor is fixedly connected with the main chamber through a bolt. The main chamber, the impeller and the turbine housing are fixedly connected through the interference fit between the shaft and the shaft fixed seat. The heat radiation baseplate is fixedly connected with the main chamber through the bolt.

In one embodiment, the water cooling liquid inlet/outlet is provided with an outer connection pipe first fixed hole. The water cooling liquid inlet/outlet is fixedly connected with an outer connection pipe. The outer connection pipe is provided with an outer connection pipe second fixed hole. The outer connection pipe second fixed hole corresponds to the outer connection pipe first fixed hole. The water cooling liquid inlet/outlet is fixedly connected with the outer connection pipe through a plug.

In one embodiment, the surface cover is provided with a water cooling liquid inlet/outlet hole. The water cooling liquid inlet/outlet hole is provided with an outer connection pipe third fixed hole corresponding to the outer connection pipe first fixed hole and the outer connection pipe second fixed hole and also corresponding to the plug. The quantity of the water cooling liquid inlet/outlet is two. The quantity of the mounting parts is two. The quantity of the fan blades is five. The water cooling liquid outlet is correspondingly communicated with a water outlet of the water cooling liquid inlet/outlet.

By using the above technical solutions, the present invention has the following technical effects and advantages:

The heat conducting baseplate of the water cooling radiator is a process of ultrasonically fusing an upper plastic member and a lower plastic member into a whole body. The bottom surface of the upper plastic member is provided with the ultrasonic loop wire and the ultrasonic column, which are ultrasonically fused to form the integrated heat radiation baseplate. The injection-molding integrated heat radiation baseplate and the main chamber are locked onto screw holes with screws, which is easy to realize the mass production. Without losing the heat radiation capacity, the assembling difficulty is alleviated, and the mass production is easy to realize. The performance is not attenuated, and the working hours are reduced. This fixing way avoids the deformation and copper heat radiation surface caused by directly locking the copper heat radiation baseplate with the screw, and can be better applied to the high-density and high-power-consumption fields requiring the liquid cooling heat radiation such as PC computers, servers, laser televisions and the like.

BRIEF DESCRIPTION OF THE DRAWINGS

To more clearly describe the technical solutions in the embodiments of the present invention, the drawings required to be used in the description of the embodiments will be simply presented below. It should be understood that the following drawings only show some embodiments of the present invention, so the embodiments should not be considered as limiting the scope, and for those ordinary skilled in the art, other relevant drawings can also be obtained according to the provided drawings without contributing creative labor.

Figure 1:
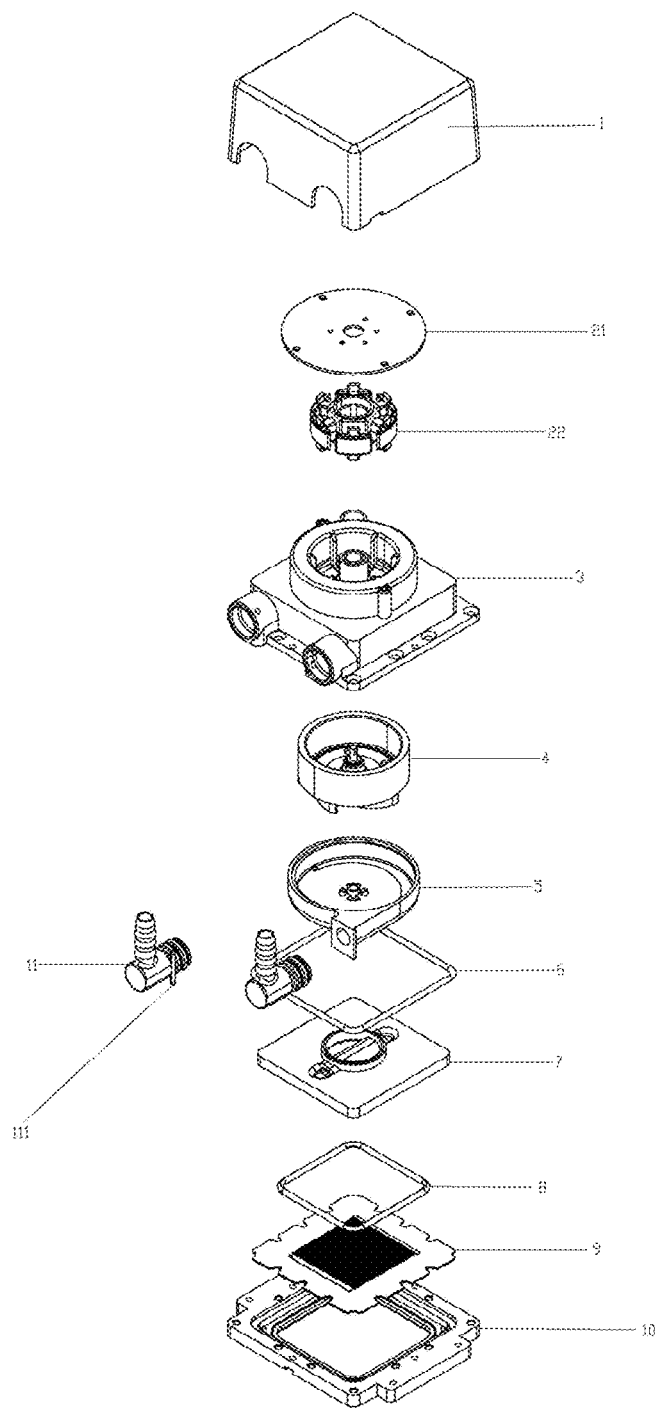
FIG. 1 is a structural exploded view of a water cooling radiator with a heat conducting plate of a full-injection-molding closed heat radiation structure.

In the drawings: surface cover 1; outer connection pipe 11; plug 111; water cooling liquid inlet/outlet hole 12; PLC circuit board 21; winding 22; shaft 23; main chamber 3; motor mounting groove 31; water cooling liquid inlet/outlet 32; outer connection pipe first fixed hole 321; motor transmission seat 33; impeller 4; fan blade 41; shaft connection seat 42; turbine housing 5; water cooling liquid outlet 51; liquid guiding groove 52; shaft fixed seat 53; water cooling liquid suction inlet 54; first sealing ring 6; upper baseplate 7; liquid inlet hole 71; liquid outlet hole 72; guiding groove 73; throttling plate 74; throttling plate through hole 741; throttling plate limiting groove 75; throttling plate fixed block 76; second sealing ring 8; metal bottom heat radiation plate insert 9; lower baseplate 10; mounting part 101; ultrasonic loop wire 102; ultrasonic column 103.

DETAILED DESCRIPTION OF THE PRESENT INVENTION

In order to facilitate the understanding of the present invention, the present invention is described below in a more comprehensive manner with reference to relevant drawings. The preferred embodiments of the present invention are shown in the drawings. However, the present invention can be implemented in many different forms and is not limited to the embodiments described herein. On the contrary, the purpose of providing these embodiments is to make the disclosure of the present invention more thorough and comprehensive.

In the description of the present invention, it should be noted that the term "a plurality of" refers to two or more unless otherwise specified, and the terms "upper," "lower", "left," "right", "inner", "outer", "front end", "rear end", "head", "tail" and the like indicating the orientation or positional relationship are based on the orientation or positional relationship shown in the drawings, and are only used for convenience in describing the present invention and simplifying the description, rather than indicating or implying the limitations to the present invention or indicating or implying that apparatuses or elements of the present invention must have a specific orientation and be constructed and operated in a specific orientation. Therefore, the terms cannot be understood as limitations to the present invention.

At the same time, in the description of the present invention, unless otherwise clearly defined and limited, the terms "connected" and "connection" should be understood in a broad sense, for example, it can be a fixed connection, a detachable connection, or an integral connection; a mechanical connection or an electrical connection; and a direct connection or an indirect connection through an intermediate medium. For those ordinary skilled in the art, the specific meaning of the above-mentioned terms in the present invention can be understood in specific circumstances.

EMBODIMENT

Figure 2:
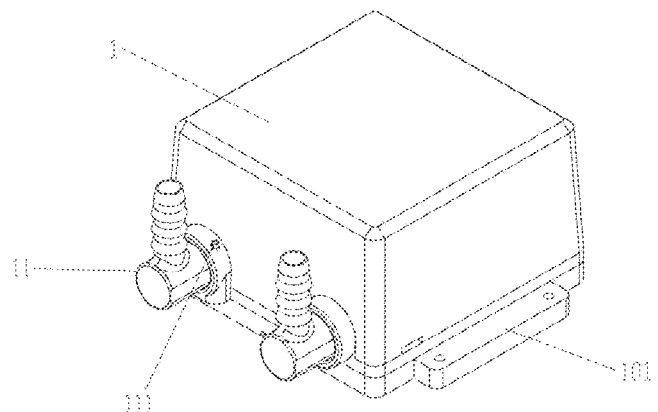
FIG. 2 is a three-dimensional structural schematic diagram of the water cooling radiator with the heat conducting plate of the full-injection-molding closed heat radiation structure.
Figure 3:
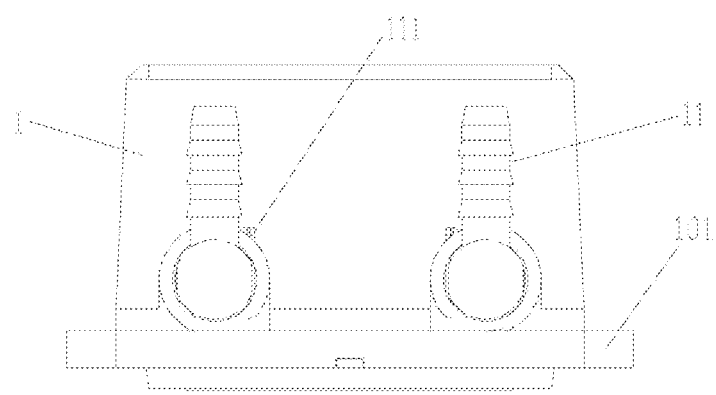
FIG. 3 is a front view of the water cooling radiator with the heat conducting plate of the full-injection-molding closed heat radiation structure.
Figure 4:
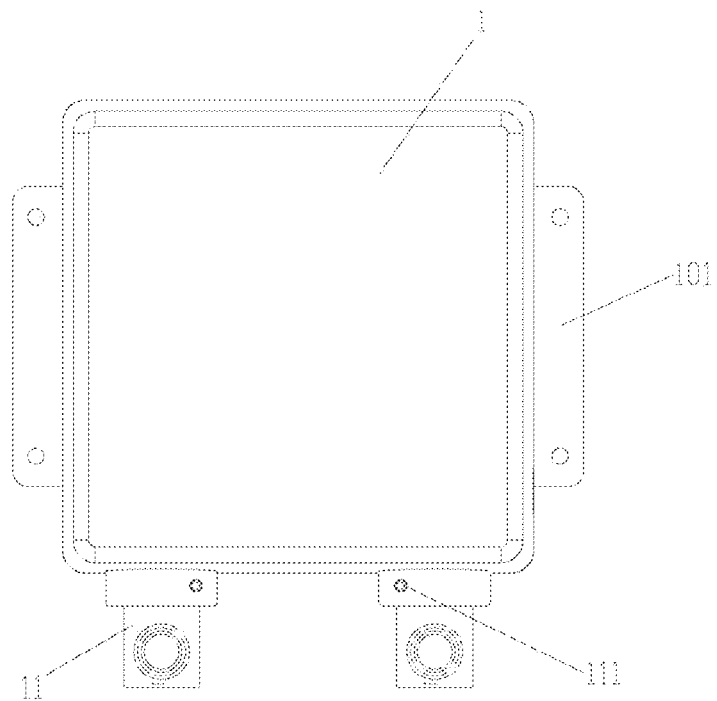
FIG. 4 is a top view of the water cooling radiator with the heat conducting plate of the full-injection-molding closed heat radiation structure.
Figure 5:
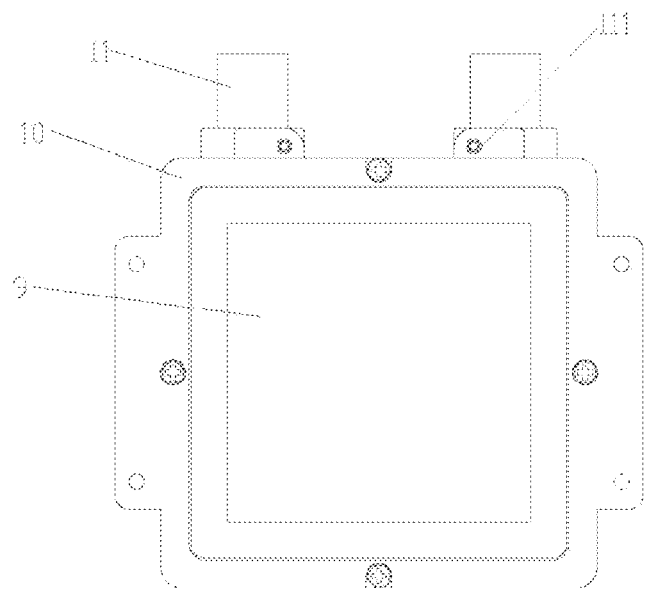
FIG. 5 is a bottom view of the water cooling radiator with the heat conducting plate of the full-injection-molding closed heat radiation structure.
Figure 6:
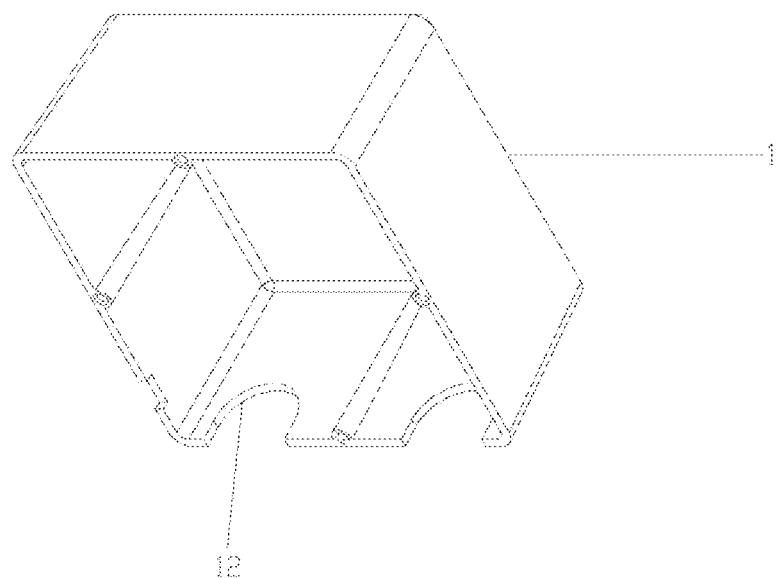
FIG. 6 is a three-dimensional structural schematic diagram of a surface cover of the water cooling radiator with the heat conducting plate of the full-injection-molding closed heat radiation structure.
Figure 7:
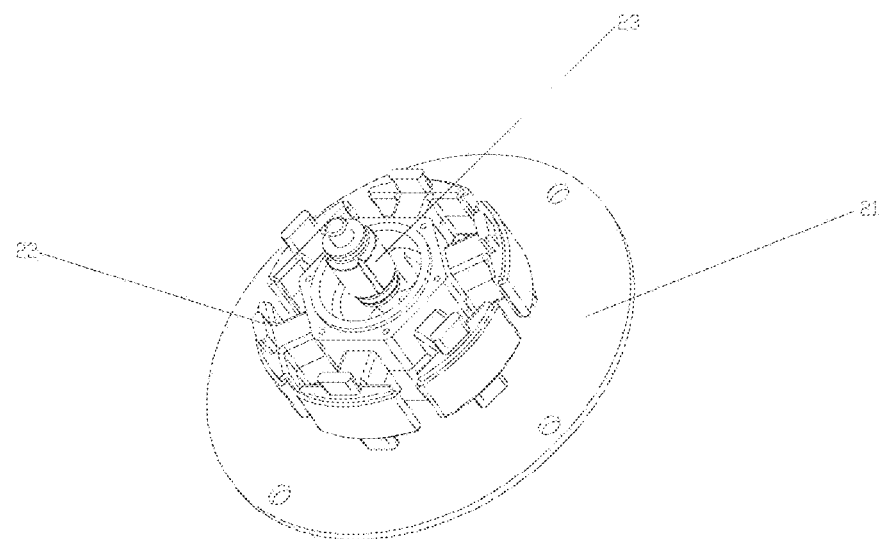
FIG. 7 is a three-dimensional structural schematic diagram of a motor of the water cooling radiator with the heat conducting plate of the full-injection-molding closed heat radiation structure.
Figure 8:
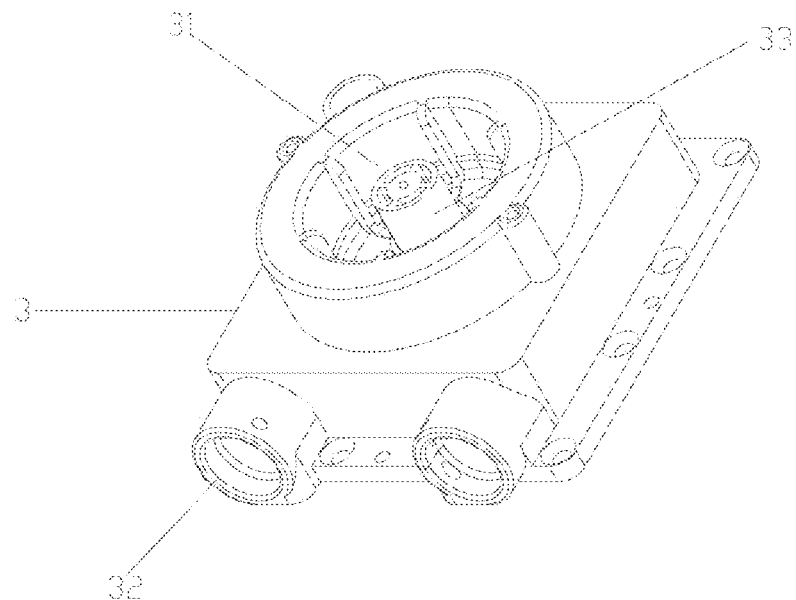
FIG. 8 is a three-dimensional structural schematic diagram of a main chamber of the water cooling radiator with the heat conducting plate of the full-injection-molding closed heat radiation structure.
Figure 9:
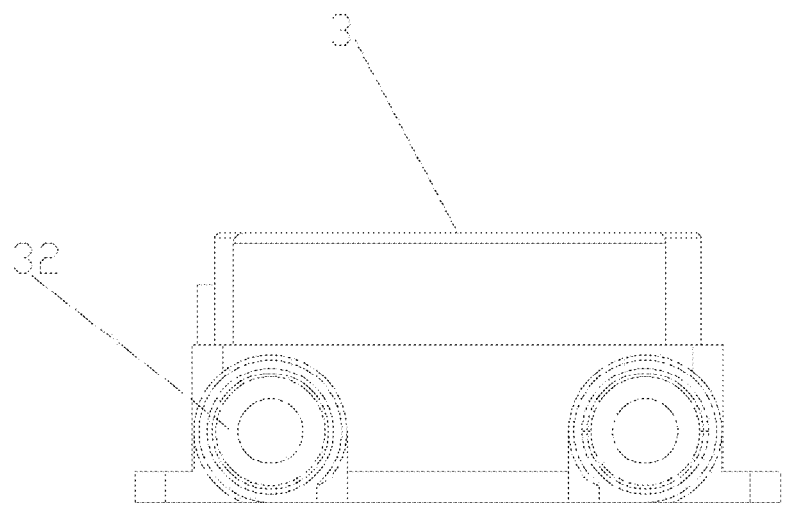
FIG. 9 is a front view of the main chamber of the water cooling radiator with the heat conducting plate of the full-injection-molding closed heat radiation structure.
Figure 10:
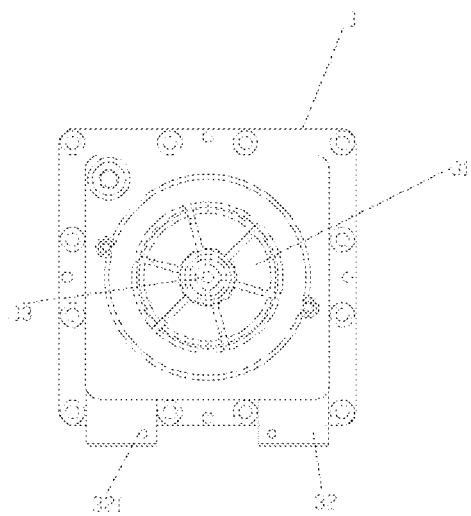
FIG. 10 is a top view of the main chamber of the water cooling radiator with the heat conducting plate of the full-injection-molding closed heat radiation structure.
Figure 11:
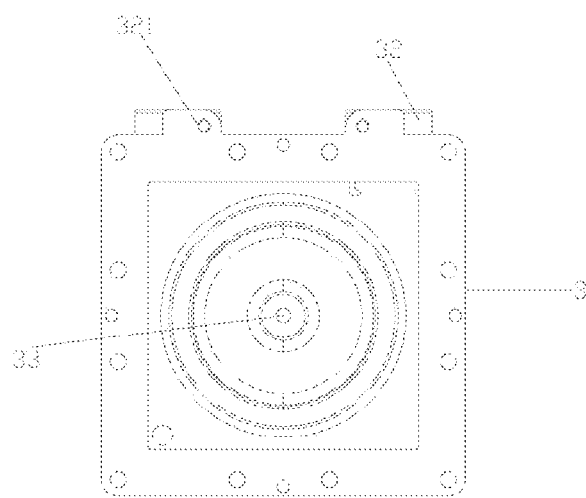
FIG. 11 is a bottom view of the main chamber of the water cooling radiator with the heat conducting plate of the full-injection-molding closed heat radiation structure.
Figure 12:
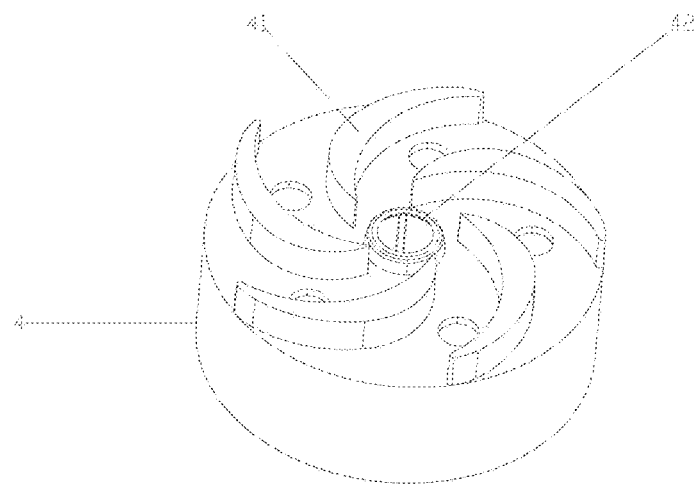
FIG. 12 is a three-dimensional structural schematic diagram of an impeller of the water cooling radiator with the heat conducting plate of the full-injection-molding closed heat radiation structure.
Figure 13:
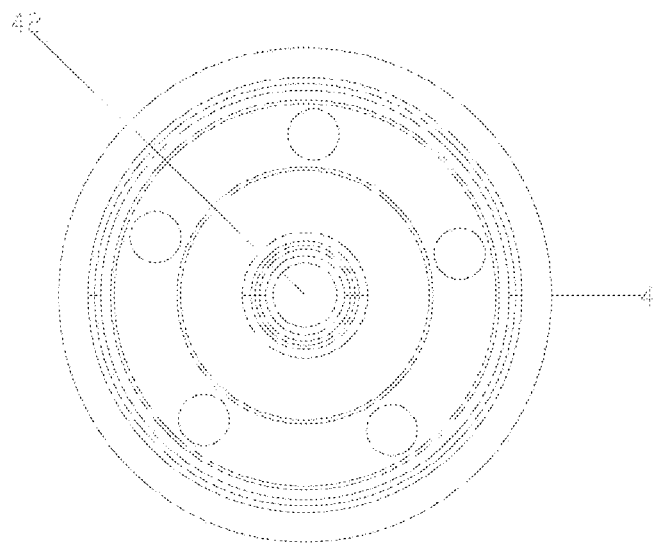
FIG. 13 is a top view of the impeller of the water cooling radiator with the heat conducting plate of the full-injection-molding closed heat radiation structure.
Figure 14:
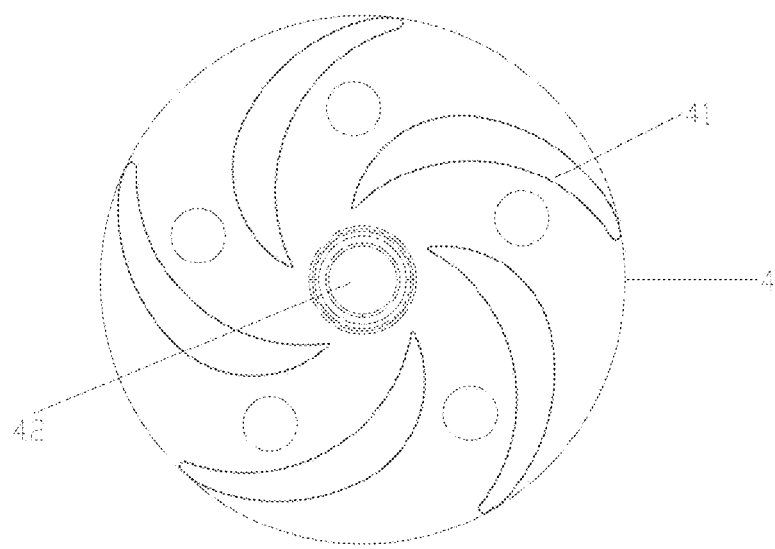
FIG. 14 is a bottom view of the impeller of the water cooling radiator with the heat conducting plate of the full-injection-molding closed heat radiation structure.
Figure 15:
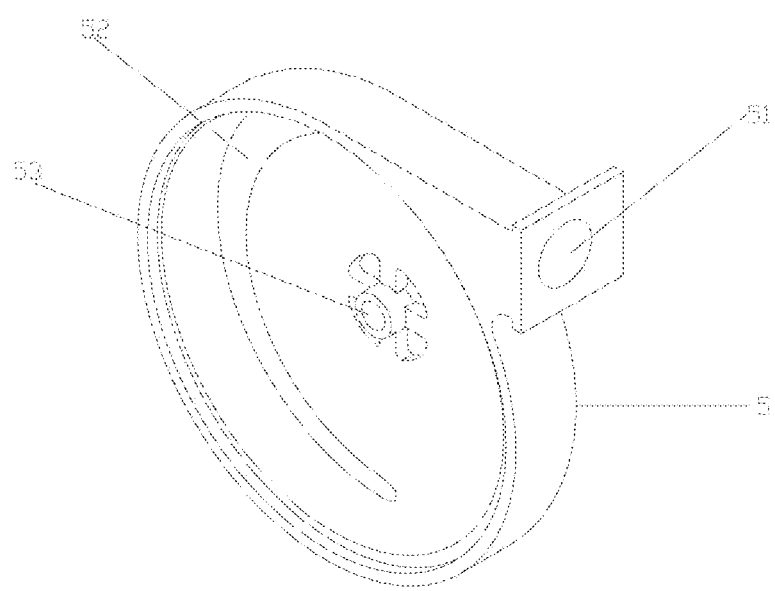
FIG. 15 is a three-dimensional structural schematic diagram of a turbine housing of the water cooling radiator with the heat conducting plate of the full-injection-molding closed heat radiation structure.
Figure 16:
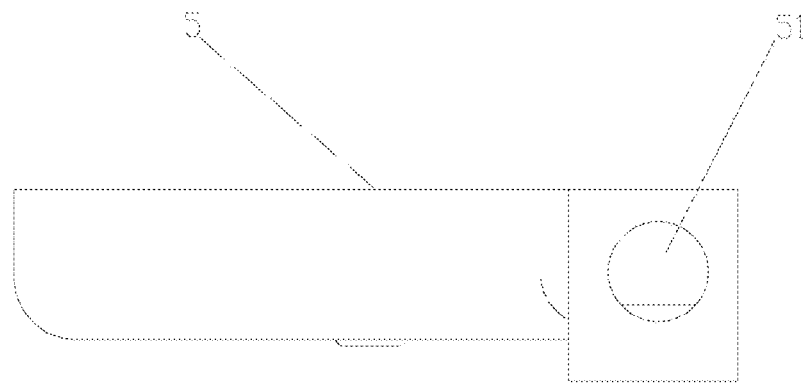
FIG. 16 is a front view of the turbine housing of the water cooling radiator with the heat conducting plate of the full-injection-molding closed heat radiation structure.
Figure 17:
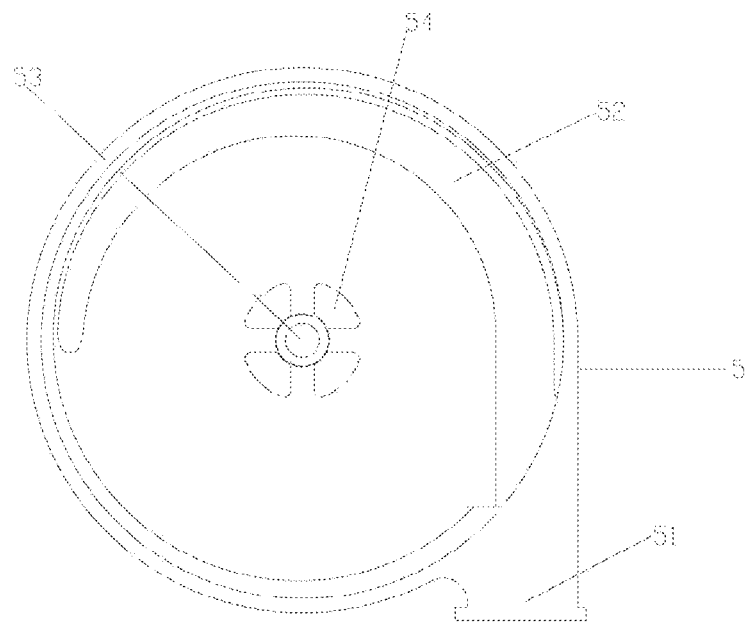
FIG. 17 is a top view of the turbine housing of the water cooling radiator with the heat conducting plate of the full-injection-molding closed heat radiation structure.
Figure 18:
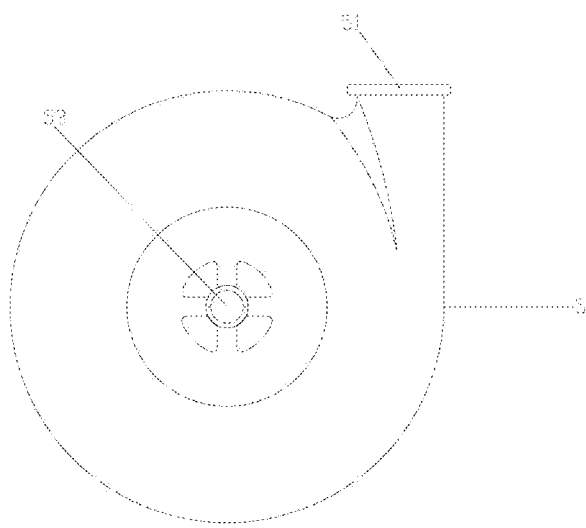
FIG. 18 is a bottom view of the turbine housing of the water cooling radiator with the heat conducting plate of the full-injection-molding closed heat radiation structure.
Figure 19:
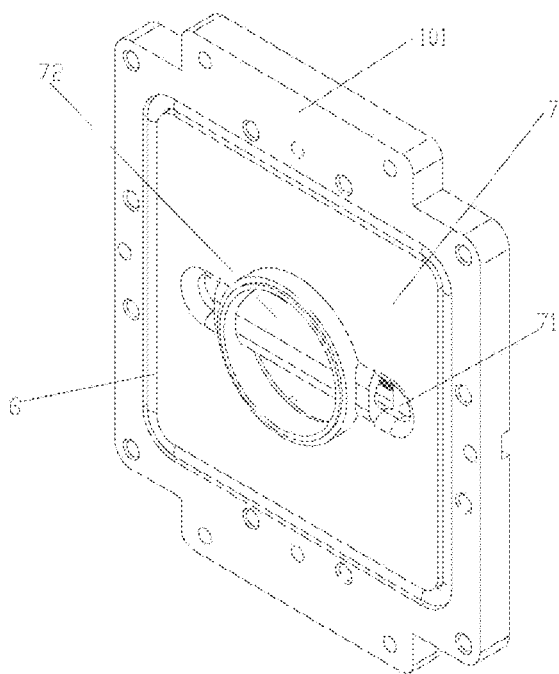
FIG. 19 is a three-dimensional structural schematic diagram of the turbine housing of the water cooling radiator with the heat conducting plate of the full-injection-molding closed heat radiation structure.
Figure 20:
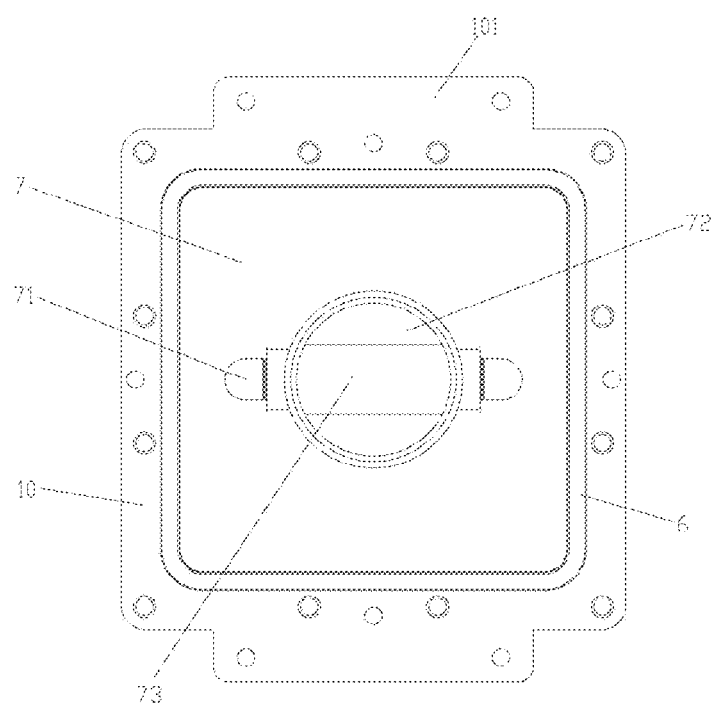
FIG. 20 is a three-dimensional structural schematic diagram of a heat radiation baseplate of the water cooling radiator with the heat conducting plate of the full-injection-molding closed heat radiation structure.
Figure 21:
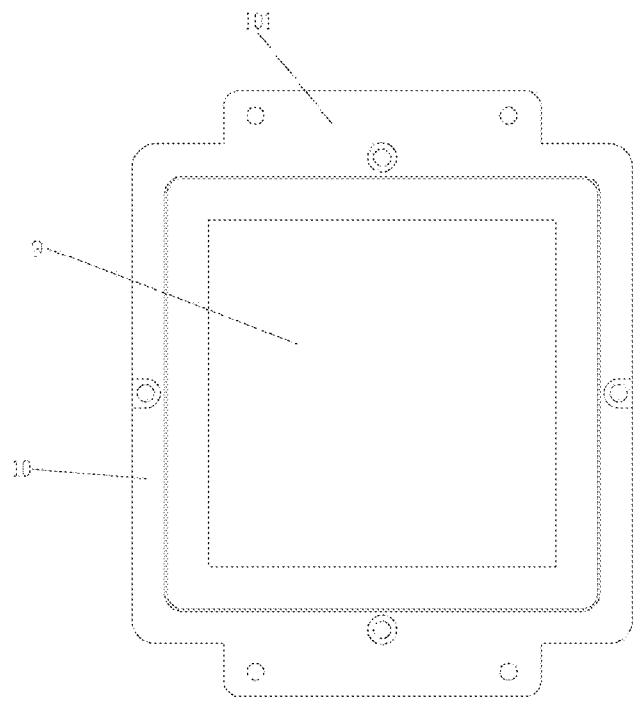
FIG. 21 is a top view of the heat radiation baseplate of the water cooling radiator with the heat conducting plate of the full-injection-molding closed heat radiation structure.
Figure 22:
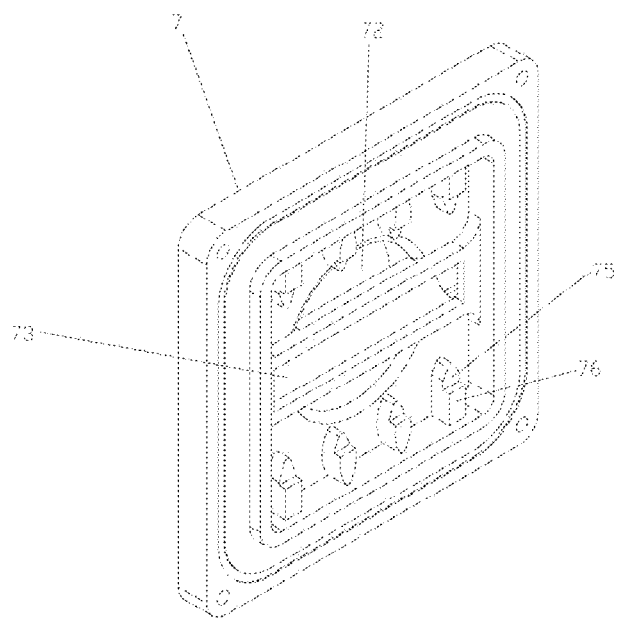
FIG. 22 is a bottom view of the heat radiation baseplate of the water cooling radiator with the heat conducting plate of the full-injection-molding closed heat radiation structure.
Figure 23:
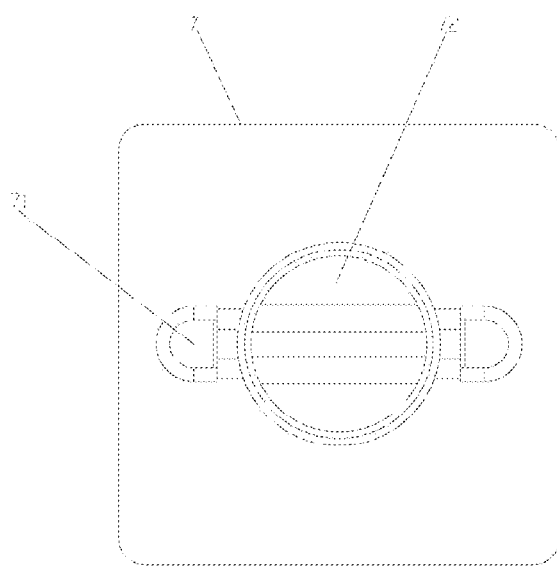
FIG. 23 is a top view of an upper baseplate of the water cooling radiator with the heat conducting plate of the full-injection-molding closed heat radiation structure.
Figure 24:
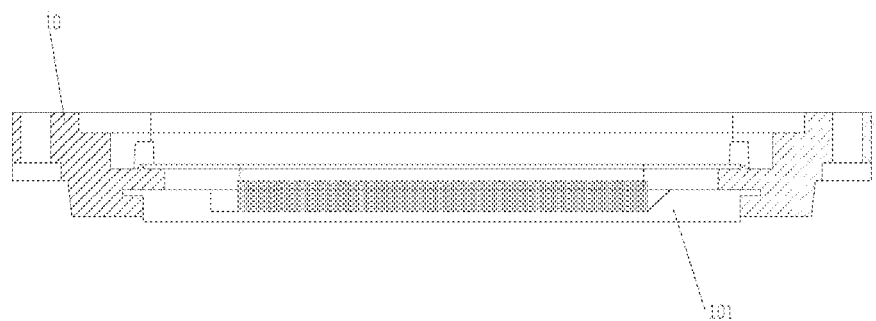
FIG. 24 is a structural schematic diagram of a partial section of the water cooling radiator with the heat conducting plate of the full-injection-molding closed heat radiation structure.
Figure 25:
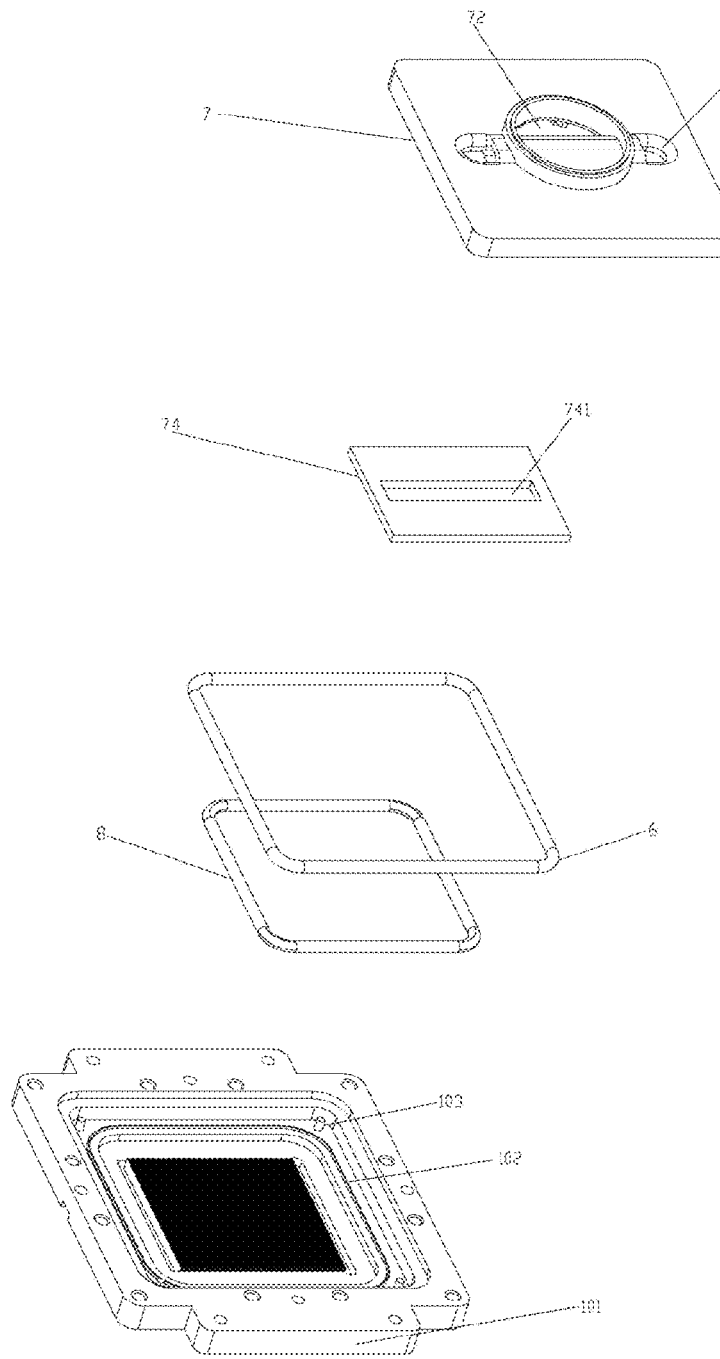
FIG. 25 is a structural exploded view of the heat radiation baseplate of the water cooling radiator with the heat conducting plate of the full-injection-molding closed heat radiation structure.

Referring to FIG. 1 to FIG. 25, the present invention provides a technical solution: a water cooling radiator with a heat conducting plate of a full-injection-molding closed heat radiation structure.

A specific structure of the water cooling radiator with the heat conducting plate of the full-injection-molding closed heat radiation structure and a connection relationship of various components are described below:

The water cooling radiator of the present invention is provided with a surface cover 1, a motor, a main chamber 3, an impeller 4, a turbine housing 5 and a heat radiation baseplate. The top of the main chamber 3 is provided with a motor mounting groove 31, so that the motor can be arranged at the motor mounting groove 31, thereby improving the integrity. A motor transmission seat 33 is arranged in the motor mounting groove 31, so that a twisting force of the motor can pass through the motor transmission seat 33 through a shaft 23 to be transferred to the impeller 4, making the motor not contact the water cooling liquid inside the main chamber 3, thereby preventing the short circuit. One side of the main chamber 3 is provided with water cooling liquid inlet/outlet 32 respectively for inputting and outputting water cooling liquid. The impeller 4 is arranged at the bottom of the main chamber 3 and corresponds to the bottom outer side of the motor mounting groove 31. The bottom of the impeller 4 is provided with fan blades 41 for driving the water cooling liquid to be discharged from the water cooling liquid outlet 51, and the impeller 4 is provided with a shaft connection seat 42, which makes the twisting force of the shaft 23 transferred to the impeller 4. The turbine housing 5 is arranged at the lower side of the impeller 4, the turbine housing 5 is provided with a water cooling liquid outlet 51, and the bottom of the turbine housing 5 is provided with water cooling liquid suction inlets 54. The heat radiation baseplate is arranged at the bottom outer side of the turbine housing 5. The heat radiation baseplate is provided with an upper baseplate 7 and a lower baseplate 10. The upper baseplate 7 is provided with a liquid inlet hole 71 and a liquid outlet hole 72. The lower end of the liquid outlet hole 72 is fixedly connected with a guiding groove 73, the guiding groove 73 is in an inverted U shape, and two ends of the guiding groove are communicated with the liquid inlet hole 71, so that the water cooling liquid needs to enter the guiding groove 73 from the liquid inlet hole 71 and enters the heat radiation baseplate through a throttling plate through hole 741 from the guiding groove 73 to exchange heat with a metal bottom heat radiation plate insert 9. The bottom surface of the upper baseplate 7 is provided with a throttling plate limiting groove 75. The bottom surface of the upper base plate 7 is provided with the throttling plate 74. The throttling plate 74 is connected with the upper baseplate 7 in a limiting contact manner through the throttling plate limiting groove 75, so that the flow rate of the water cooling liquid is reduced, the water cooling liquid can exchange the heat with the metal bottom heat radiation plate insert 9 more fully before flowing out from the liquid outlet hole 72. The throttling plate 74 is provided with a throttling plate through hole 741 corresponding to the guiding groove 73. The bottom of the lower baseplate 10 is inlaid and connected with a metal bottom heat radiation plate insert 9. The inlaid connection method of the metal bottom heat radiation plate insert 9 may be that a copper heat radiation plate is embedded into a precise mold, then plastics are injected by an injection molding machine to form the lower baseplate 10, and the plastics are injected by the injection molding machine in a similar way to form the upper baseplate 7, and then the upper baseplate and the lower baseplate are ultrasonically fused into an integral workpiece. This locking way avoids the deformation and copper heat radiation surface caused by directly locking the copper heat radiation baseplate with the screw. The water cooling radiator reduces the deformation or surface damage of the heat radiation baseplate in the machining and assembling process without affecting the heat radiation and heat conducting effect, reduces the production cost, can be better suitable for the requirement of the existing market on the deformation or surface damage of the baseplate, and has higher heat exchanging efficiency.

The existing water cooling heat radiation baseplate adopts detachable bulk members that are directly locked onto the heat radiation baseplate with the screws, so that the assembling effect is poor, and the heat radiation baseplate is easy to damage. The inner side of the lower baseplate 10 is provided with an ultrasonic loop wire 102 and an ultrasonic column 103. The outer side of the lower baseplate 10 is provided with mounting parts 101. The upper baseplate 7 and the lower baseplate 10 are ultrasonically fused to form the integrated heat radiation baseplate through the ultrasonic loop wire 102 and the ultrasonic column 103, and the entire heat radiation baseplate is a whole body, so that the assembling difficulty is greatly alleviated, and the working hours can be reduced. This design adopts an integral injection molding method of the precise mold to solve the connection relationship of the assembling seal between the heat radiation baseplate and a water guiding chamber that is directly locked to the heat radiation baseplate with the screws. The bottom inner side of the turbine housing 5 is provided with the liquid guiding groove 52, so that the water cooling liquid can be better to discharge. One end of the liquid guiding groove 52 is connected with the water cooling liquid outlet 51. The bottom of the turbine housing 5 is provided with a shaft fixed seat 53, and the shaft fixed seat 53 is used for fixing the top end of a shaft 23, so that the motor is stable and does not vibrate.

Furthermore, the throttling plate limiting groove 75 is arranged on a throttling plate fixed block 76; and the throttling plate fixed block 76 is fixedly connected onto the bottom surface of the upper baseplate 7, so that a lowest position of the throttling plate limiting groove 75 is higher than a horizontal plane where the throttling plate limiting groove 75 is disposed. The water cooling liquid enters a cavity of the main chamber 3 from the water cooling liquid inlet/outlet 32 and enters the heat radiation baseplate through the liquid inlet hole 71 to contact the metal bottom heat radiation plate insert 9. Then the water cooling liquid passes through a clearance formed between the throttling plate limiting groove 75 and the throttling plate 74 and passes through the water cooling liquid suction inlets 54 from the liquid outlet hole 72 to reach the inner side of the turbine housing 5. Then the water cooling liquid passes through the impeller 4 and flows out from the water cooling liquid outlet 51, thereby forming a heat radiation mechanism. The water cooling liquid cooled externally re-enters from the water cooling liquid inlet/outlet 32, forming a heat radiation cycle. Since the motor is not located inside the main chamber 3, the impact of the problems such as the spontaneous heating of the motor on the heat radiation efficiency can be better reduced, and the integrity is high. The main chamber 3, the impeller 4, the turbine housing 5 and the heat radiation baseplate are miniaturized, so that the land occupation is small, and the miniaturization trend of the existing computer can be better satisfied.

Furthermore, a first sealing ring 6 and a second sealing ring 8 are arranged between the upper baseplate 7 and the lower baseplate 10 to realize the further sealing and leakage prevention of the water cooling liquid and effectively prevent the damage of the heat radiation device caused by the liquid leakage, so that the application reliability of the present product is effectively improved.

The quantity of the water cooling liquid suction inlets 54 is four. The water cooling liquid suction inlets are arranged correspondingly to the liquid outlet hole 72, so that the water cooling liquid in the heat radiation baseplate is sucked into the turbine housing 5 from the water cooling liquid suction inlets 54 and is discharged from the water cooling liquid outlet 51. The circulation of the water cooling liquid realizes the heat exchange, thereby realizing the heat radiation effect.

Moreover, the metal bottom heat radiation plate insert 9 is a copper bottom heat radiation plate insert, which can better exchange the heat, thereby improving the heat radiation efficiency.

The motor is electrically connected with an external power supply. The motor transfers the power to the impeller 4 through the shaft 23, so that the water cooling liquid is sucked out by a turbine from the heat radiation baseplate and then discharged from the water cooling liquid outlet 51.

The heat conducting performance is further improved. The surface cover 1 is fixedly connected with the main chamber 3 through a bolt. The motor is fixedly connected with the main chamber 3 through a bolt. The main chamber 3, the impeller 4 and the turbine housing 5 are fixedly connected through the interference fit between the shaft 23 and the shaft fixed seat 53. The heat radiation baseplate is fixedly connected with the main chamber 3 through the bolt, thereby realizing the mounting of the whole body and forming an integrated component, so that the completeness is high, and while the assembling difficulty is alleviated, the performance can still be improved.

The water cooling liquid inlet/outlet 32 is provided with an outer connection pipe first fixed hole 321 with the size and shape matched with the existing heat radiation fan and other external heat radiation mechanisms, which is convenient for users to mount, thereby improving the environmental applicability. The water cooling liquid inlet/outlet 32 is fixedly connected with an outer connection pipe 11. The outer connection pipe 11 is provided with an outer connection pipe second fixed hole. The outer connection pipe second fixed hole corresponds to the outer connection pipe first fixed hole 321. The water cooling liquid inlet/outlet 32 is fixedly connected with the outer connection pipe 11 through a plug 111 so as not to be easily separated during the application, so that the reliability is high, and the excessive power of the turbine for discharging the water cooling liquid is prevented from causing the separation and damaging the heat radiation elements.

Moreover, the surface cover 1 is provided with a water cooling liquid inlet/outlet hole 12. The water cooling liquid inlet/outlet hole 12 is provided with an outer connection pipe third fixed hole corresponding to the outer connection pipe first fixed hole 321 and the outer connection pipe second fixed hole and also corresponding to the plug 111, so that the thickness of the present product is further reduced, and the internal structures such as the motor, the main chamber 3, the impeller 4, the turbine housing 5 and the heat radiation baseplate can be protected. The quantity of the water cooling liquid inlet/outlet 32 is two. One is an inlet, and one is an outlet for the water cooling liquid. The quantity of the mounting parts 101 is two, which can better match the existing mounting frame, thereby improving the applicability. The quantity of the fan blades 41 is five, and the water cooling liquid outlet 51 corresponds to the water outlet of the water cooling liquid inlet/outlet 32, so that after the installation, the water cooling liquid outlet 51 closely contacts the water outlet of the water cooling liquid inlet/outlet 32, thereby alleviating the weakening of the suction force of the turbine, and further improving the heat radiation efficiency.

The working principle and application method of the above heat radiation fan are described below:

A motor part of the motor is mounted in the motor mounting groove 31 of the main chamber 3, and the shaft 23 of the motor passes through the motor transmission seat 33 on the bottom of the motor mounting groove 31 to be fixedly connected with the motor connection seat 42 on the impeller 4, so that the impeller 4 is in power connection with the motor. The top end of the shaft 23 is fixedly connected to the shaft fixed seat 53 on the bottom of the turbine housing 5, so that the vibration of the motor shaft can be reduced, and the turbine housing 5 is further fixed. The water cooling liquid outlet 51 of the turbine housing 5 is communicated with the outlet of the water cooling liquid inlet/outlet 32, and the inlet of the water cooling liquid inlet/outlet 32 is communicated with an inner cavity of the main chamber 3 (i.e. a cavity formed between the main chamber 3 and the heat radiation baseplate). The main chamber 3 is fixedly connected with the heat radiation baseplate through a bolt, and a junction therebetween is provided with the first sealing ring 6 and the second sealing ring 9 to prevent the liquid leakage, so that the water cooling liquid enters the heat radiation baseplate from the inner cavity of the main chamber 3 through the liquid inlet hole 71 to contact the metal bottom heat radiation plate insert 9. The water cooling liquid passes through the clearance formed between the throttling plate limiting groove 75 and the throttling plate 74 and passes through the water cooling liquid suction inlets 54 to reach the inner side of the turbine housing 5 from the liquid outlet hole 72, and then the water cooling liquid passes through the impeller 4 and flows out from the water cooling liquid outlet 51, thereby forming a heat radiation mechanism. The water cooling liquid cooled externally re-enters from the water cooling liquid inlet/outlet 32, thereby forming a heat radiation cycle. The bottom of the lower baseplate 10 is inlaid and connected with the metal bottom heat radiation plate insert 9, and this locking way avoids the deformation and the copper heat radiation surface caused by directly locking the copper heat radiation baseplate with the screw. Specifically, the copper heat radiation plate is embedded into the precise mold, and plastics are injected by an injection molding machine to form the lower baseplate 10, and then the plastics are injected by the injection molding machine to form the upper baseplate 7. The upper baseplate 7 and the lower baseplate 10 are ultrasonically fused to form an integral workpiece, so that the tightness is good, and the unfavorable effect in the prior art such as the deformation or surface damage of the heat radiation baseplate during the installation or assembling can be effectively prevented from affecting the heat radiation and heat conducting effect in the machining and assembling process.

The above-mentioned embodiments only describe several implementation modes of the present invention, and the description is relatively specific and detailed, but it shall not be understood as a limitation to the patent scope of the present invention. It shall be pointed out that for those ordinary skilled in the art, without departing from the concept of the present invention, several modifications and improvements can be made, which all fall within the protection scope of the present invention. Therefore, the protection scope of the patent of the present invention shall be subjected to the appended claims.

What is claimed is:

1. A water cooling radiator with a heat conducting plate of a full-injection-molding closed heat radiation structure, comprising: a surface cover (1), a motor, a main chamber (3), an impeller (4), a turbine housing (5) and a heat radiation baseplate, wherein the top of the main chamber (3) is provided with a motor mounting groove (31); a motor transmission seat (33) is arranged in the motor mounting groove (31); one side of the main chamber (3) is provided with a water cooling liquid inlet/outlet (32); the impeller (4) is arranged at the bottom of the main chamber (3) and corresponds to the bottom outer side of the motor mounting groove (31); the bottom of the impeller (4) is provided with fan blades (41), and the impeller (4) is provided with a shaft connection seat (42); the turbine housing (5) is arranged at the lower side of the impeller (4); the turbine housing (5) is provided with a water cooling liquid outlet (51); the bottom of the turbine housing (5) is provided with a water cooling liquid suction inlet (54); the heat radiation baseplate is arranged at the bottom outer side of the turbine housing (5); the heat radiation baseplate is provided with an upper baseplate (7) and a lower baseplate (10); the upper baseplate (7) is provided with a liquid inlet hole (71) and a liquid outlet hole (72); the lower end of the liquid outlet hole (72) is fixedly connected with a guiding groove (73); the guiding groove (73) is in an inverted U shape; two ends of the guiding groove are communicated with the liquid inlet hole (71); the bottom surface of the upper baseplate (7) is provided with a throttling plate limiting groove (75); the bottom surface of the upper baseplate (7) is provided with a throttling plate (74); the throttling plate (74) is connected with the upper baseplate (7) in a limiting contact manner through the throttling plate limiting groove (75); the throttling plate (74) is provided with a throttling plate through hole (741) corresponding to the guiding groove (73); and the bottom of the lower baseplate (10) is inlaid and connected with a metal bottom heat radiation plate insert (9).

2. The water cooling radiator with the heat conducting plate of the full-injection-molding closed heat radiation structure according to claim 1, wherein the inner side of the lower baseplate (10) is provided with an ultrasonic loop wire (102) and an ultrasonic column (103); the outer side of the baseplate (10) is provided with mounting parts (101); the upper baseplate (7) and the lower baseplate (10) are ultrasonically fused to form an integrated heat radiation baseplate through the ultrasonic loop wire (102) and the ultrasonic column (103); the bottom inner side of the turbine housing (5) is provided with a liquid guiding groove (52), and one end of the liquid guiding groove (52) is connected with the water cooling liquid outlet (51); and the bottom of the turbine housing (5) is provided with a shaft fixed seat (53).

3. The water cooling radiator with the heat conducting plate of the full-injection-molding closed heat radiation structure according to claim 2, wherein the throttling plate limiting groove (75) is arranged on a throttling plate fixed block (76), and the throttling plate fixed block (76) is arranged on the bottom surface of the upper baseplate (7) and fixedly connected with the upper baseplate; the water cooling liquid enters a cavity of the main chamber (3) from the water cooling liquid inlet/outlet (32), and enters the heat radiation baseplate through the liquid inlet hole (71) to contact the metal bottom heat radiation plate insert (9); then the water cooling liquid passes through a clearance formed between the throttling plate limiting groove (75) and the throttling plate (74) and passes through the water cooling liquid suction inlets (54) from the water outlet hole (72) to reach the inner side of the turbine housing (5); and then the water cooling liquid passes through the impeller (4) and flows out from the water cooling liquid outlet (51), thereby forming a heat radiation mechanism.

4. The water cooling radiator with the heat conducting plate of the full-injection-molding closed heat radiation structure according to claim 3, wherein a first sealing ring (6) and a second sealing ring (8) are arranged between the upper baseplate (7) and the lower baseplate (10).

5. The water cooling radiator with the heat conducting plate of the full-injection-molding closed heat radiation structure according to claim 4, wherein the quantity of the water cooling liquid suction inlets (54) is four; and the water cooling liquid suction inlets are arranged correspondingly to the liquid outlet hole (72).

6. The water cooling radiator with the heat conducting plate of the full-injection-molding closed heat radiation structure according to claim 1, wherein the metal bottom heat radiation plate insert (9) is a copper bottom heat radiation plate insert.

7. The water cooling radiator with the heat conducting plate of the full-injection-molding closed heat radiation structure according to claim 2, wherein the motor is composed of a PLC circuit board (21), a winding (22) and a shaft (23).

8. The water cooling radiator with the heat conducting plate of the full-injection-molding closed heat radiation structure according to claim 1, wherein the surface cover (1) is fixedly connected with the main chamber (3) through a bolt; the motor is fixedly connected with the main chamber (3) through a bolt; the main chamber (3), the impeller (4) and the turbine housing (5) are fixedly connected through the interference fit between the shaft (23) and the shaft fixed seat (53); and the heat radiation baseplate is fixedly connected with the main chamber (3) through the bolt.

9. The water cooling radiator with the heat conducting plate of the full-injection-molding closed heat radiation structure according to claim 8, wherein the water cooling liquid inlet/outlet (32) is provided with an outer connection pipe first fixed hole (321); the water cooling liquid inlet/outlet (32) is fixedly connected with an outer connection pipe (11); the outer connection pipe (11) is provided with an outer connection pipe second fixed hole; the outer connection pipe second fixed hole corresponds to the outer connection pipe first fixed hole (321); and the water cooling liquid inlet/outlet (32) is fixedly connected with the outer connection pipe (11) through a plug (111).

10. The water cooling radiator with the heat conducting plate of the full-injection-molding closed heat radiation structure according to claim 9, wherein the surface cover (1) is provided with a water cooling liquid inlet/outlet hole (12); the water cooling liquid inlet/outlet hole (12) is provided with an outer connection pipe third fixed hole corresponding to the outer connection pipe first fixed hole (321) and the outer connection pipe second fixed hole and also corresponding to the plug (111); the quantity of the water cooling liquid inlet/outlet (32) is two; the quantity of the mounting parts (101) is two; the quantity of the fan blades (41) is five; and the water cooling liquid outlet (51) is correspondingly communicated with a water outlet of the water cooling liquid inlet/outlet (32).

* * * * *